United States Patent
Fischer et al.

(10) Patent No.: US 8,885,143 B2
(45) Date of Patent: Nov. 11, 2014

(54) PROJECTION EXPOSURE APPARATUS FOR MICROLITHOGRAPHY FOR THE PRODUCTION OF SEMICONDUCTOR COMPONENTS

(75) Inventors: Juergen Fischer, Heidenheim (DE); Armin Schoeppach, Aalen (DE); Matthias Orth, Neresheim-Elchingen (DE); Norbert Muehlberger, Aalen-Ebnat (DE); Thorsten Rassel, Huettlingen (DE); Armin Werber, Gottenheim (DE); Juergen Huber, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 550 days.

(21) Appl. No.: 13/071,237

(22) Filed: Mar. 24, 2011

(65) Prior Publication Data
US 2011/0235012 A1    Sep. 29, 2011

Related U.S. Application Data

(63) Continuation of application No. PCT/EP2009/062584, filed on Sep. 29, 2009.

(60) Provisional application No. 61/101,274, filed on Sep. 30, 2008.

(30) Foreign Application Priority Data

Sep. 30, 2008 (DE) .......................... 10 2008 049 616

(51) Int. Cl.
*G03F 7/20* (2006.01)

(52) U.S. Cl.
CPC ............ *G03F 7/709* (2013.01); *G03F 7/70825* (2013.01); *G03F 7/70266* (2013.01); *G03F 7/70883* (2013.01); *G03F 7/70991* (2013.01)

USPC ................................ 355/67; 355/77; 359/872

(58) Field of Classification Search
CPC .... G02B 7/182; G02B 7/1822; G02B 7/1827; G02B 7/1828; G02B 7/185; G03F 7/70; G03F 7/7015; G03F 7/70825; G03F 7/70266; G03F 7/70883; G03F 7/709; G03F 7/70991
USPC .................... 355/30, 53, 67, 77; 359/871–872
See application file for complete search history.

(56) References Cited

U.S. PATENT DOCUMENTS 6,388,823 B1 * 5/2002 Gaber et al. .................. 359/819
6,912,077 B2 6/2005 Weiss et al.
(Continued)

FOREIGN PATENT DOCUMENTS

DE          101 34 387 A1       1/2003
DE     10 2005 062 081          7/2007
(Continued)

OTHER PUBLICATIONS

German Office Action for corresponding DE Appl No. 10 2008 049 616.2-51, with English translation, dated May 18, 2009.
(Continued)

*Primary Examiner* — Colin Kreutzer
(74) *Attorney, Agent, or Firm* — Fish & Richardson P.C.

(57) ABSTRACT

A projection exposure apparatus for microlithography for the production of semiconductor components includes at least one optical assembly with at least one optical element which can be actuated in a mechanically controlled manner is mounted in a structure. For carrying out the mechanical actuation, a control signal transmission device and/or an energy transmission device are/is provided, which introduce(s) no parasitic mechanical effects into the optical assembly at least during specific operating states of the projection exposure apparatus.

26 Claims, 5 Drawing Sheets

(56) References Cited

U.S. PATENT DOCUMENTS

| | | |
|---|---|---|
| 7,190,437 B2 | 3/2007 | Butler et al. |
| 7,538,273 B2 | 5/2009 | Butler et al. |
| 2003/0058422 A1 | 3/2003 | Loopstra et al. |
| 2003/0164934 A1 | 9/2003 | Nishi et al. |
| 2003/0168615 A1 | 9/2003 | Loopstra et al. |
| 2003/0197914 A1 | 10/2003 | Cox et al. |
| 2005/0140955 A1 | 6/2005 | Butler et al. |
| 2006/0103908 A1 | 5/2006 | Loopstra et al. |
| 2006/0232866 A1* | 10/2006 | Sai et al. ............... 359/849 |
| 2007/0036494 A1 | 2/2007 | Fischer |
| 2007/0076310 A1 | 4/2007 | Sakino et al. |
| 2008/0100894 A1* | 5/2008 | Asada ................. 359/198 |
| 2008/0239503 A1* | 10/2008 | Conradi et al. ............... 359/666 |
| 2008/0288108 A1 | 11/2008 | Gross |
| 2009/0086178 A1 | 4/2009 | Shibazaki |
| 2009/0225296 A1 | 9/2009 | Fischer |

FOREIGN PATENT DOCUMENTS

| | | |
|---|---|---|
| DE | 101 40 208 A1 | 3/2008 |
| JP | 10-270535 | 10/1998 |
| JP | 2003-203860 | 7/2003 |
| JP | 2006-041551 | 2/2006 |
| JP | 2006-140504 | 6/2006 |
| JP | 2007-103657 | 4/2007 |
| JP | 2007-115879 | 5/2007 |
| JP | 2007-123334 | 5/2007 |
| JP | 2007-523485 | 8/2007 |
| JP | 2008-042201 | 2/2008 |
| JP | 2008-112756 | 5/2008 |
| JP | 2009-088512 | 4/2009 |
| WO | WO 2007/071307 | 6/2007 |
| WO | WO 2008012336 A1 * | 1/2008 ............... G03F 7/20 |
| WO | WO 2009/041702 | 4/2009 |

OTHER PUBLICATIONS

Japanese Office Action, with translation thereof, for corresponding JP Appl No. 2011-528362, dated Feb. 5, 2013.

International Search Report and a Written Opinion from the counterpart PCT Application No. PCT/EP2009/062584, dated Apr. 16, 2010.

* cited by examiner

PROJECTION EXPOSURE APPARATUS FOR MICROLITHOGRAPHY FOR THE PRODUCTION OF SEMICONDUCTOR COMPONENTS

CROSS-REFERENCE TO RELATED APPLICATIONS

This application is a continuation of, and claims benefit under 35 USC 120 to, international application PCT/EP2009/062584, filed Sep. 29, 2009, which claims benefit under 35 USC 119 of German Application No. 10 2008 049 616.2, filed Sep. 30, 2008 and under 35 USC 119(e) of U.S. Ser. No. 61/101,274, filed Sep. 30, 2008. The entire contents of international application PCT/EP2009/062584 are hereby incorporated by reference in their entirety.

FIELD

The disclosure relates to a projection exposure apparatus for microlithography for the production of semiconductor components, in which at least one optical assembly with at least one optical element which can be actuated in a mechanically controlled manner is mounted in a structure, wherein a control signal transmission device and/or an energy transmission device are/is provided for carrying out the mechanical actuation.

BACKGROUND

In the case of high-performance objectives such as are used for example as projection objectives in projection exposure apparatuses for microlithography for the production of semiconductor components, in particular in the EUV range, the optical elements used therein, such as, for example, lenses or mirror elements and the like, desirably have a very high positional accuracy (e.g. of an order of magnitude of less than 100 pm in the EUV range). Often, this can be achieved, inter alia, only when no undesired or parasitic mechanical effects are introduced onto the optical elements and/or the optical assemblies in which the optical elements are mounted. Undesired or parasitic mechanical effects are those mechanical effects which are not caused by the mounting of the optical element as such. Parasitic mechanical effects encompass qualitatively mechanical friction and damping, mechanical stresses, mechanical forces and moments, in particular owing to mechanical short circuit with respect to the structure (such as housing, measuring structures or the like), for example via cable connections, and also vibrations or interference excitations in the higher-frequency range (e.g. greater than 20 Hz in the EUV range).

For the correction of image aberrations in projection objectives for semiconductor lithography, it is known to use of two basic types of manipulators, position manipulators and deformation manipulators. In the case of the position manipulators, the sensitivity of the optical effect of an optical element to the change in position thereof is utilized to achieve the desired correction of the wavefront in the case of a suitable displacement. In contrast thereto, in the case of deformation manipulators, the sensitivity of the optical effect of an optical element to mechanical deformation is utilized to obtain the desired correction effect.

A deformation manipulation of an optical element in a projection objective of a projection exposure apparatus for microlithography is known from US 2007/0036494 A1.

In order to be able to carry out such mechanical actuations or manipulations, the optical element or the optical assembly is provided with corresponding sensors, actuators and, if appropriate, a control device. These devices have to be supplied with energy and also actuating and measurement signals. This can be associated with the problem of carrying out these energy and control or regulating signal transmissions without introducing undesired or parasitic forces and moments and also vibrations onto the internally mounted optical or mechanical element. This cannot be ensured in the case of known cable connections.

Reference is made to US 2005/0140955 A1 and DE 10 2005 062 081 A1.

SUMMARY

The present disclosure provides a projection exposure apparatus for microlithography for the production of semiconductor components which enables a parasitic-force-free control signal and energy transmission to an optical element which is to be manipulated and/or deformed and is arranged in an optical assembly in a structure of a projection exposure apparatus.

According to the disclosure, the projection exposure apparatus, for carrying out the mechanical actuation, has a control signal transmission device and/or an energy transmission device, which introduce(s) no parasitic mechanical effects into the optical assembly at least during specific operating states of the projection exposure apparatus.

This accordingly makes it possible to introduce energy for manipulation or deformation of an optical element at least approximately in a manner free of forces or without additional forces or moments onto the optical element, that is to say for example to transmit it from an external structure of the projection exposure apparatus to the internally arranged optical or mechanical element which is to be manipulated or deformed. A force-free transmission of signals for the measurement and regulation or control of the system is likewise made possible. This advantageously results in a high positional accuracy or positional stability of the optical elements within the projection exposure apparatus. At least during specific operating states of the projection exposure apparatus, no undesired or parasitic mechanical effects, that is to say no mechanical effects in addition to those which are caused anyway by the mounting, are introduced into the optical element by the energy and/or signal transmission. In other words the optical element is free of such parasitic mechanical effects.

It is very advantageous if a contactless transmission of the control signals and/or the energy is provided by the control signal transmission device and/or the energy transmission device, respectively.

For lack of a direct mechanical connection, advantageously no mechanical stresses, forces or moments can be applied to the optical assembly either.

The contactless transmission of the control signals and/or of the energy can be effected by induction or electromagnetic waves, in particular light or radio waves. The signal transmission and energy transmission without mechanical connection can thus be effected by light or radio.

The control signal transmission device and/or the energy transmission device can have at least one transmitting device and at least one receiving device. The structure and/or the optical element or the optical assembly can have at least one transmitting device and/or at least one receiving device of the control signal transmission device and/or energy transmission device.

The energy transmission from the structure to the optical element involves at least one transmitter on the part of the structure and one receiver on the part of the optical element or the optical assembly. The transmission of the control signals or actuating signals likewise involves a transmitter on the structure and a receiver on the optical element. The measured value feedback involves a transmitter on the optical element or the optical assembly and a receiver on the structure of the projection exposure apparatus. The control signals or actuating signals (desired values and measured values) can be transmitted in parallel or serially.

It is advantageous if the control signal transmission device and/or the energy transmission device have/has at least one signal processing device. Signal processing electronics may be desired on the optical element or the optical assembly in order to be able correspondingly to convert the actuating signals obtained or to be able to communicate measurement signals.

According to the disclosure, it can furthermore be provided that the optical element and/or the optical assembly have/has a subordinate control or regulating device for independently carrying out the mechanical actuation of the optical element, which feeds back status signals.

Accordingly, a subordinate or secondary regulating circuit could advantageously be integrated directly on the optical element or the optical assembly, which circuit for example independently effects adjustment to a predefined desired value of the actuation. As a result, the data traffic between the optical assembly and an, in particular central, superordinate control device arranged on the structure or else outside the projection exposure apparatus can be considerably reduced, whereby energy can also be saved. It is advantageous if the subordinate control or regulating device feeds back status signals. The latter can comprise for example a signal for the transmission of an error code (e.g. impermissible regulating deviation, actuator/sensor failure) or a READY-signal (successful attainment of the new desired value).

The signal transmission can be effected in analogue fashion or digitally.

The at least one transmitting device can be embodied as in particular controllable optoelectronic actuator or light source.

At least one receiving device can be embodied as optoelectronic detector, in particular photoresistor, photodiode, solar or photovoltaic cell, phototransistor, photo cell or the like. The signal transmission can accordingly be implemented with a controllable light source and a photo element as in the case of an optocoupler, for example. The energy transmission can be effected with a light source and a photocell as energy generator or energy converter on the optical assembly or the optical element.

At least one transmitting device can be embodied as radio transmitter, in particular RFID reading device. Correspondingly, the at least one receiving device can be embodied as radio receiver or RFID transponder. Accordingly, the signal transmission and energy transmission can be implemented via radio in the manner comparable with RFID (Radio Frequency Identification) technology.

The optical assembly or the optical element can be programmed freely as it were as an autonomous optical element by use of a subordinate control or regulating device by use of the control signal transmission. Correspondingly, a communication of new regulating algorithms, software updates or the like is also possible. New functions can be implemented at any time via software changes.

The optical assembly can have at least one actuator and/or at least one sensor for the mechanical actuation and/or sensing, respectively, of the optical element. In this case the energy supply is to be ensured depending on the desired powers for the actuator system and sensor system, and also for the in particular signal processing electronics at the optical assembly. It is advantageous, therefore, if the actuators and/or the sensors, too, of the optical assembly take up or output a power loss that is as low as possible. Technologies with a power loss that is as low as possible should therefore be preferred. Actuators taken into consideration include, by way of example, piezo-actuators, in particular in the case of predominantly static operation, or mechanical and electrostatic drives.

The desired energy can be provided in line with demand, no energy storage being effected.

According to the disclosure, it can alternatively or additionally be provided that the optical assembly has an energy store. The energy supply can therefore also be ensured by an energy store (rechargeable battery, capacitor, battery, fuel cell or the like).

The energy store can be chargeable by, in particular, constant energy feeding. Furthermore, it can serve for buffering or cushioning power spikes during the adjustment or actuation. The energy supply can also be implemented exclusively by an energy store (e.g. battery) for the entire lifetime of the projection exposure apparatus or up to envisaged maintenance intervals.

It is advantageous if the energy store can be charged in specific operating states, in particular exposure pauses of the projection exposure apparatus, in particular by mechanical contact-making.

As an alternative, the signal and energy transmission can also be effected by a mechanical connection optimized for the respective desired properties.

It is advantageous if the at least one already existing mechanical link of the optical assembly at the structure, in particular a bearing, an actuator, or a weight compensation device, is embodied as control signal transmission device and/or as energy transmission device or as part of such a device. The signal and/or energy transport can thus be effected by the existing mechanical link. Mechanical links can be actuators, gravity compensators and bearings of the optical element. The optical element is generally mounted in a statically determined manner in the optical assembly. Accordingly, no parasitic mechanical effects, i.e. mechanical effects in addition to those which are caused anyway by the statically determined mounting, are introduced into the optical element. During the manufacture of the optical element, in general the deformations that will subsequently occur in the projection exposure apparatus and are caused by the mounting or the force due to weight are already taken into account and the optical properties are correspondingly coordinated.

According to the disclosure, it can furthermore be provided that the control signal transmission device and/or the energy transmission device or a part of such a device are/is embodied as controlled, actively tracked line connection.

A line actively tracked to the optical element can thus be provided, the link of the line at the structure being moved in such a way that no parasitic forces or moments act on the optical element.

It is advantageous if the control signal transmission device and/or the energy transmission device or a part of such a device are/is embodied as additional mechanical link of the optical assembly at the structure, wherein the mechanical link has at least one spring element and at least one absorber mass. A mechanical connection can thus be permitted, the embodiment as spring with interposed absorber mass being effected, with the aim of a damping-free link, which acts as a mechanical low-pass filter and permits excitations from the structure only below a defined frequency.

According to the disclosure, it can furthermore be provided that the energy transmission device embodied as radiation source, which, for the mechanical actuation of the optical element, emits a radiation, in particular thermal radiation, onto the optical element in a targeted manner. The energy input is thus effected by thermal irradiation and actuation by the utilisation of thermal expansion effects, whereby translation movements and deformations of the optical element can be achieved.

The mechanical actuation of the optical element that is achieved by the radiation emitted in a targeted manner can be measured interferometrically or indirectly by a thermal imaging camera, that is to say via the detected heat distribution in the optical element. The interferometric measurement can be effected in scanning fashion by way of full image or partial images.

The mechanical actuation of the optical element can comprise a position manipulation and/or a deformation manipulation. The optical element can be embodied as lens or mirror, by way of example.

BRIEF DESCRIPTION OF THE DRAWINGS

Advantageous configurations and developments of the disclosure emerge from the dependent claims. Exemplary embodiments of the disclosure are specified below with reference to the drawings.

In the figures.

DETAILED DESCRIPTION

Figure 1:
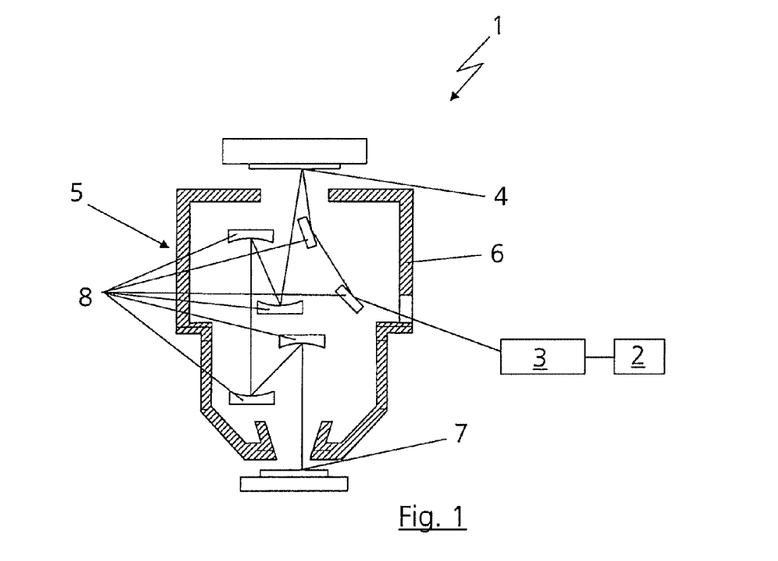
FIG. 1 shows a basic construction of an EUV projection exposure apparatus with a light source, an illumination system and a projection objective.

FIG. 1 illustrates an EUV projection exposure apparatus 1 comprising a light source 2 an EUV illumination system 3 for illuminating a field in an object plane 4, in which a structure-bearing mask (not illustrated) is arranged, and also a projection objective 5 having a housing 6 as structure and a beam course for imaging the mask arranged in the object plane 4 onto a light-sensitive substrate 7 for the production of semiconductor components. The projection objective 5 has optical elements embodied as mirrors 8 for the purpose of beam shaping. The mirrors 8 can be arranged or mounted in the form of mirrors 8a to 8h, as can be seen from FIGS. 2, 4 to 10, in optical assemblies 9a to 9h or mounts or the like in the housing 6 of the projection objective 5. The illumination system 3 also has corresponding optical elements or assemblies for beam shaping or beam directing. These and housing of the illumination system 3 are not illustrated in more specific detail, however. Besides the housing 6 of the projection objective 5, the abovementioned housing of the illumination system 3 and corresponding mounts or a measuring structure are also appropriate as structure. A measuring structure of this type is described in DE 101 34 387 A1 for example.

The disclosure is described in more detail below on the basis of an EUV projection exposure apparatus. It goes without saying that the disclosure can also be used in projection exposure apparatuses which operate in other wavelength ranges.

Figure 2:
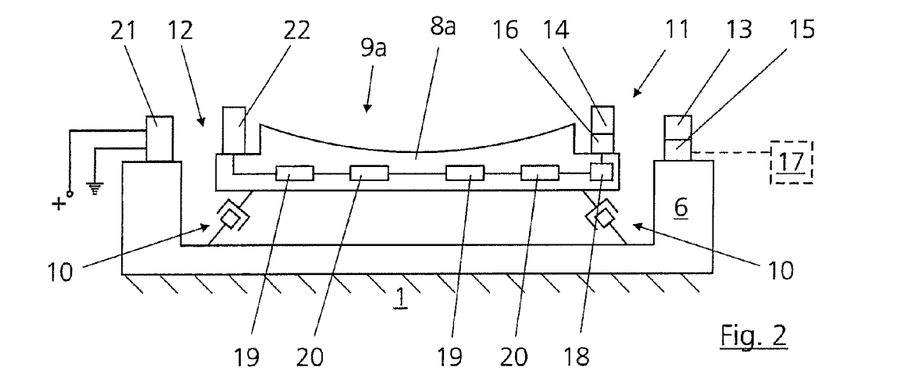
FIG. 2 shows a schematic illustration of an optical assembly in a projection exposure apparatus according to the disclosure with a contactless control signal transmission device and energy transmission device.

FIG. 2 illustrates an optical assembly 9a with a mirror 8a that can be actuated in a mechanically controlled manner, the optical assembly being mounted in the housing 6 of the projection objective 5 via actuators 10 or weight compensation devices (not illustrated). In the present case, the actuators are embodied as Lorentz-actuators 10. However, further actuators, such as piezo-actuators, for instance, could also be provided in further exemplary embodiments. For carrying out the mechanical actuation, a control signal transmission device 11 and an energy transmission device 12 are provided, which introduce no additional or parasitic mechanical effects into the optical assembly 9a. A contactless transmission of the control signals and of the energy is provided by the control signal transmission device 11 and the energy transmission device 12, respectively. The contactless transmission of the control signals and of the energy by the control signal transmission device 11 and the energy transmission device 12, respectively, is effected via electromagnetic waves. In further exemplary embodiments, this could also be effected via induction. The control signal transmission device 11 has a transmitting device 13 and receiving device 14. The control signal transmission of the control signal transmission device 11 is effected via radio waves, for which reason the transmitting device is embodied as radio transmitter 13. The receiving device is correspondingly embodied as radio receiver 14. Antenna devices are not illustrated in more specific detail. The control signal transmission device 11 has a signal processing device 15, which is arranged in the region of the housing 6 and is connected to a control or regulating device 17 of the projection exposure apparatus 1 (indicated by dashed lines). Furthermore, a signal processing device 16 of the optical assembly 9a is provided, which is connected to a control device 18 of the optical assembly 9a. The control device 18 is connected to piezo-actuators 19 and sensors 20. The mechanical controlled actuation of the mirror 8a can be carried out via the piezo-actuators 19 and the sensors 20. The piezo-actuators 19 output a low power loss in static operation. In order to enable a bi-directional communication between the control device 18 of the optical assembly 9a and the control device 17 of the projection exposure apparatus 1, the radio transmitter 13 can additionally have a reception functionality and the radio receiver 14 can additionally have a transmission functionality.

Radio transmitter 13 and radio receiver 14 can also be realised in the manner of an RFID (Radio Frequency Identification) system, wherein data are stored on an electronic data carrier, the so-called transponder (e.g. radio receiver 14). The energy supply of the transponder and also the data exchange between the transponder and the RFID transmitter or the reading device (e.g. radio transmitter 13) are effected via magnetic or electromagnetic fields. In principle, an RFID system comprises two components, the transponder and the reading device or, depending on the technology used, the reading or writing/reading device. The reading device or the RFID transmitter has a radio-frequency module (transmitter and receiver), a control unit, an antenna with respect to the transponder and an interface for data exchange with other systems. The transponder is the actual data carrier of the RFID system and has an antenna and, if appropriate, a microchip.

Figure 3:
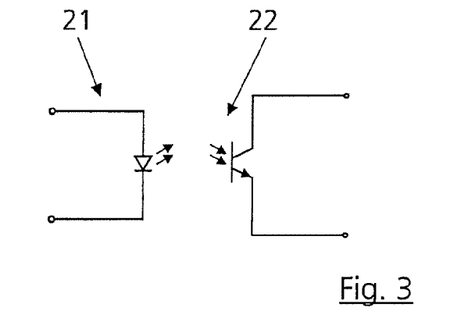
FIG. 3 shows a schematic illustration of an optical transmitting and receiving device of a control signal transmission device and/or of an energy transmission device of a projection exposure apparatus according to the disclosure.

The energy supply device 12 has a transmitting device embodied as controllable optoelectronic actuator or light source 21, and a receiving device embodied as optoelectronic detector or solar cell 22, which enable a contactless transmission of the energy via light radiation. The principle of energy transmission via light radiation is illustrated further in FIG. 3. The solar cell 22 converts the received light radiation into electrical energy, which is used to operate the piezo-actuators 19 and the sensors 20 for the controlled mechanical actuation of the mirror 8a. The mechanical actuation of the mirror 8a can comprise a position manipulation and/or a deformation manipulation. In further exemplary embodiments (not illustrated), a lens could also be provided instead of the mirror. In further exemplary embodiments, it is also possible to embody the control signal transmission device 11 optically and to realize the energy transmission device 12 as radio link or as RFID system. It is equally possible to realize both the control signal transmission and the energy transmission just via one of the two systems.

Figure 4:
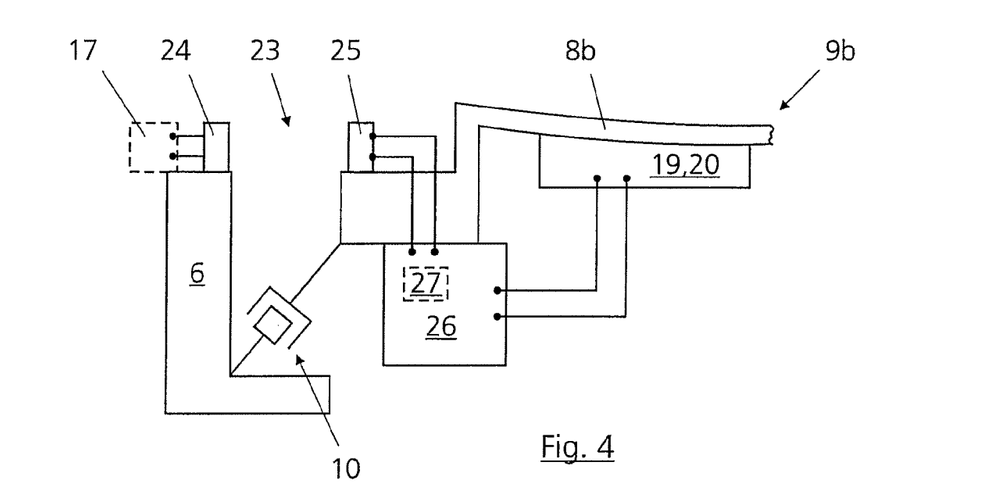
FIG. 4 shows a schematic illustration of an optical assembly in a projection exposure apparatus according to the disclosure with a contactless control signal transmission device and/or energy transmission device and an energy store.

FIG. 4 illustrates an optical assembly 9b with a mirror 8b. The mirror 8b can be deformed in a controlled manner by piezo-actuators 19 and sensors 20. A contactless control signal and energy transmission device 23 has a transmitting and receiving device 24 with a light source and an optoelectronic detector, and also a corresponding transmitting and receiving device 25. The communication between the transmitting and receiving devices 24, 25 is effected via light radiation. Furthermore, the optical assembly has an energy store 26 and a subordinate control or regulating device 27 indicted by dashed lines, by which device independent performance of the mechanical actuation of the mirror 8b can be carried out. The control or regulating device 27 feeds back status signals concerning the control signal and energy transmission device 23 to the control device 17 of the projection exposure apparatus 1. In an advantageous manner, it is possible to introduce or update the regulating algorithms or the software on the control or regulating device 27 via the optical connection 23. The energy store 26 can be charged by constant energy feeding via the control signal and energy transmission device 23. The energy store 26 also serves for buffering power spikes during the adjustment of the mirror 8b and can be embodied as rechargeable battery, capacitor, fuel cell or the like. The piezo-actuators 19 and sensors 20 can be operated by the energy store 26.

Figure 5:
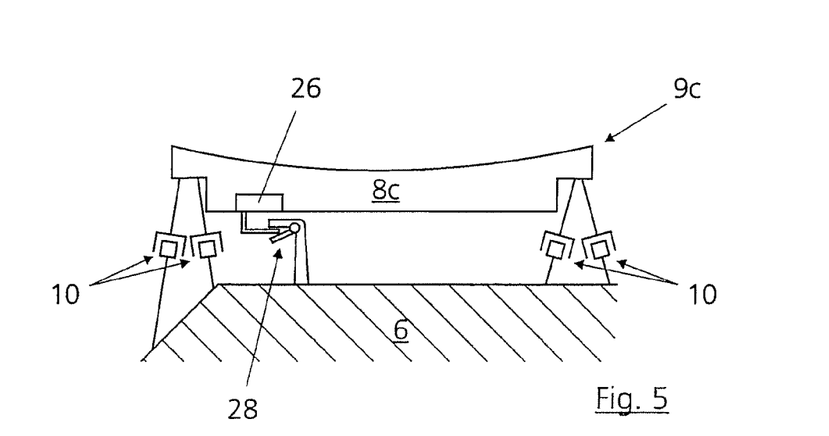
FIG. 5 shows a schematic illustration of an optical assembly in a projection exposure apparatus according to the disclosure with an energy store which is charged in exposure pauses.

As illustrated in a greatly simplified fashion in FIG. 5, the energy store 26 can be charged by a device 28 during exposure pauses of the projection exposure apparatus 1, that is to say during specific operating states, the additional mechanical parasitic effects being introduced onto an optical assembly 9c or a mirror 8c only in these exposure pauses.

Figure 6:
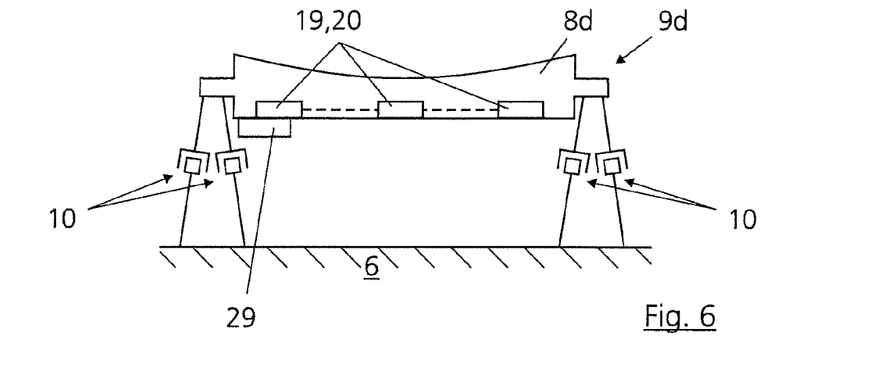
FIG. 6 shows a schematic illustration of an optical assembly in a projection exposure apparatus with an energy store in a further embodiment.

FIG. 6 illustrates an assembly 9d with a mirror 8d, which assembly has a battery for energy supply over the entire lifetime of the assembly or up to envisaged maintenance intervals, by which the piezo-actuators 19 and the sensors 20 can be operated without a further energy supply from outside being necessary. The energy store or the battery 29 should correspondingly be regarded as energy transmission device.

For the sake of simplicity, signal processing units or desired analogue/digital converters are not illustrated in more specific detail in FIGS. 4 to 10.

Figure 7:
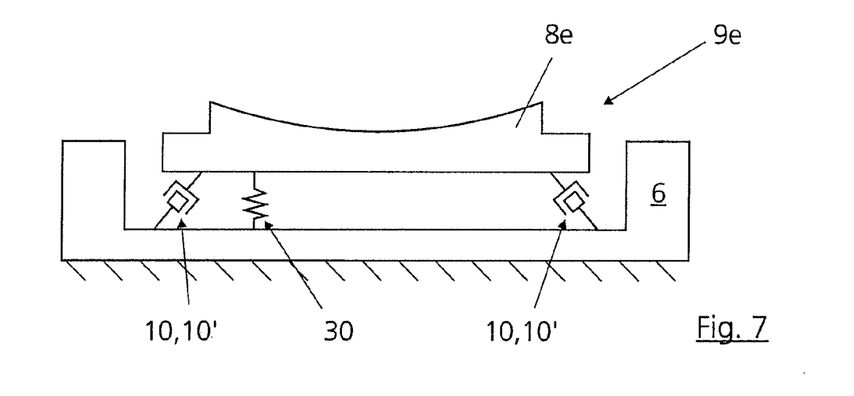
FIG. 7 shows a schematic illustration of an optical assembly in a projection exposure apparatus according to the disclosure with energy transport via existing mechanical connections.

FIG. 7 illustrates an embodiment of an optical assembly 9e with a mirror 8e, in the case of which an already existing mechanical link of the optical assembly 9e to the housing 6, namely a bearing 10' or a Lorentz actuator 10 or a weight compensation device 30, is embodied as control signal transmission device and/or energy transmission device. No additional or parasitic mechanical effects are introduced into the optical assembly 9e thereby.

Figure 8:
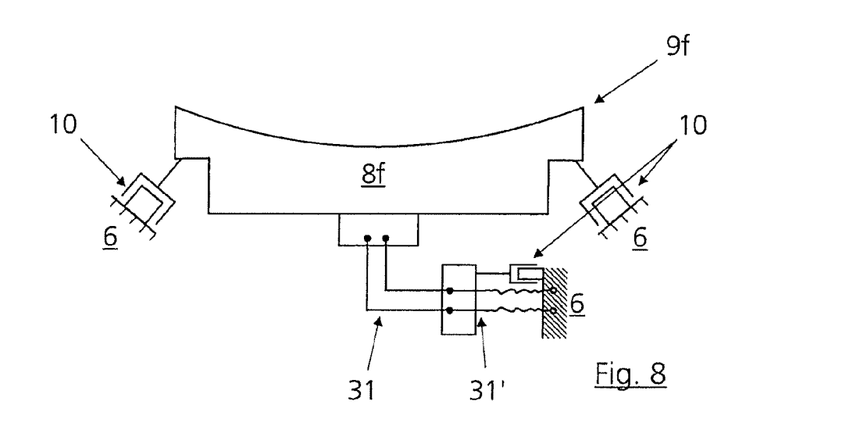
FIG. 8 shows a schematic illustration of an optical assembly in a projection exposure apparatus according to the disclosure with energy and control signal transmission via an actively tracked line connection.

FIG. 8 illustrates an optical assembly 9f with a mirror 8f, which assembly is mounted in the housing 6. The control signal transmission device and the energy transmission device are embodied as controlled, actively tracked line connection 31. The link 31' at the structure 6 is moved in such a way that no undesired forces or moments act on the mirror 8f.

Figure 9:
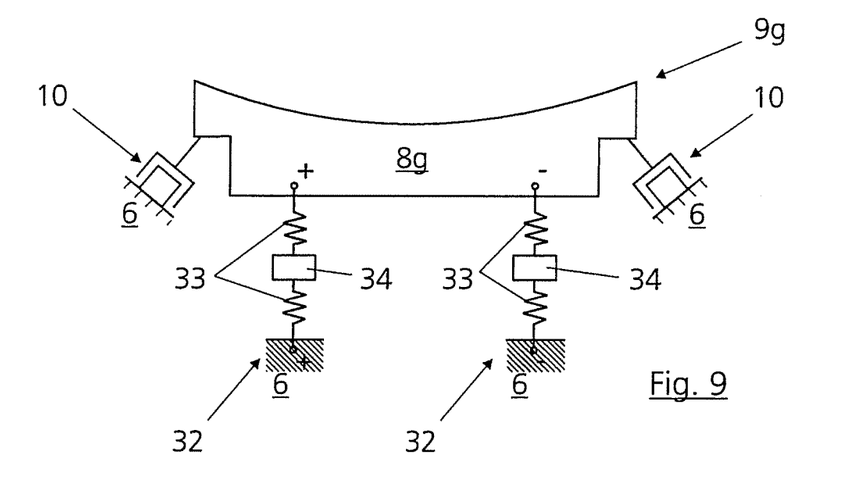
FIG. 9 shows a schematic illustration of an optical assembly in a projection exposure apparatus according to the disclosure with energy and/or control signal transmission via an additional mechanical connection.

FIG. 9 illustrates a further embodiment of an optical assembly 9g with a mirror 8g. An additional mechanical link 32 is provided for control signal transmission and/or energy transmission. The mechanical link 32 has spring elements 33 and absorber masses 34.

Figure 10:
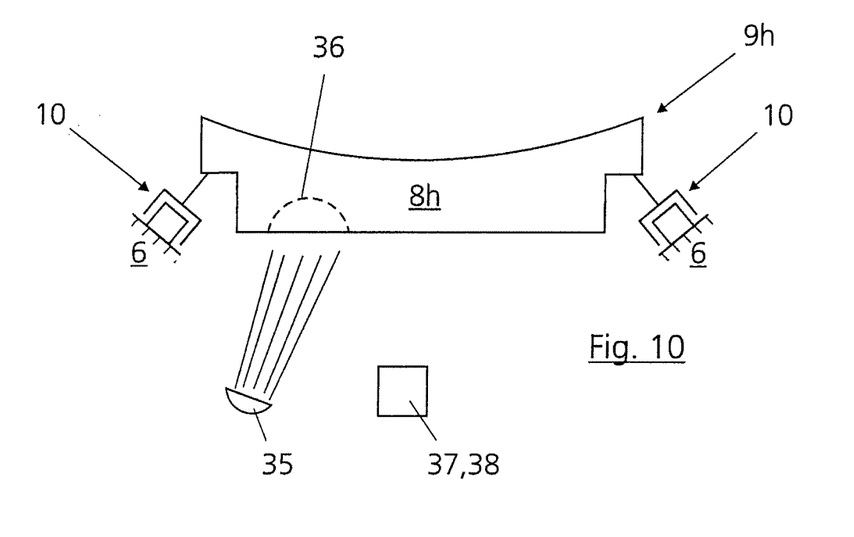
FIG. 10 shows a schematic illustration of an optical assembly in a projection exposure apparatus according to the disclosure with energy input via thermal irradiation.

FIG. 10 illustrates a further variant of an optical assembly 9h with a mirror 8h, wherein, as energy transmission device, a radiation source 35 emits a thermal radiation onto the mirror 8h for the mechanical actuation thereof. A high absorption of the thermal radiation is effected in the region 36 of the mirror 8h, whereby translation movements and deformations of the mirror 8h can be carried out with the utilisation of thermal expansion effects.

The mechanical actuation of the mirror 8h that is achieved by the radiation emitted in a targeted manner can be measured by an interferometer 37 or indirectly by a thermal imaging camera 38, that is to say via the detected heat distribution in the optical element.

Figure 11:
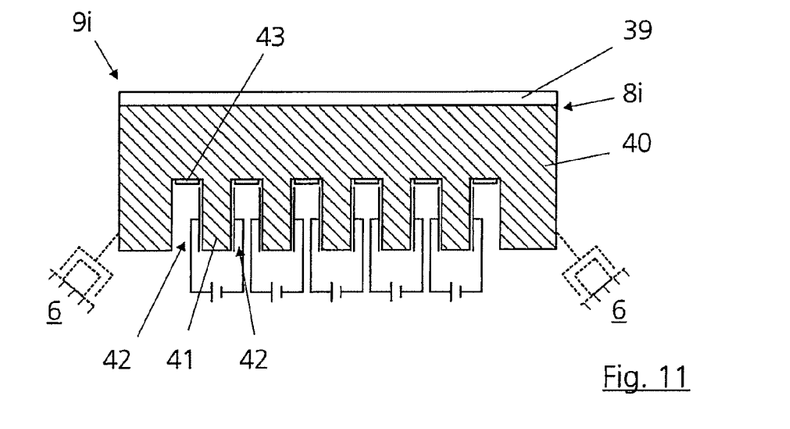
FIG. 11 shows a schematic illustration of an optical assembly in a projection exposure apparatus according to the disclosure with a monolithic partial layer composed of piezoelectric material and energy input via electrodes.

FIG. 11 illustrates a further embodiment of an optical assembly 9i with a mirror 8i having an optically active layer 39. The optical element 8i can also be considered as a part of a mirror in which it is formed integrally. The optical assembly 9i or the optical element 8i has as piezo-actuator a partial element formed in one piece respectively a monolithic partial element 40 composed of a piezoelectric material for the mechanical actuation of the optical element 8i, wherein layer systems are also considered as monolithic partial elements 40 respectively as partial elements that are formed in one piece. The longitudinal or transverse reciprocal piezoelectric effect is utilized in this case. In further exemplary embodiments, the mirror 8i can also be composed entirely of a piezoelectric material. By way of example, quartz (approximately 5 pm/V $T_C$=570° C.) or silicon dioxide (SiO$_2$), lead zirconate titanate (PZT, approximately 700 pm/V, $T_C$=400° C.) or the like are appropriate as piezoelectric material. Furthermore, the monolithic partial layer 40 or partial element formed in one piece is provided with a plurality of individual cuboid-shaped or parallelepipedal projections 41. The projections 41 of the monolithic partial layer 40 have, as energy transmission device, in each case electrodes 42 and can thus be driven individually for the targeted mechanical actuation and/or deformation, in particular of partial regions of the optical element 8$i$ or of the optically active layer 39 that are located above the parallelepipedal projections 41. The intensity of the actuation and/or deformation can be established by the magnitude of the applied electrical voltage. The actuator system is advantageously integrated as it were monolithically into the mirror 8$i$.

The actuator parallelepiped array and the electrodes 42 can be structured via precision-mechanical or micromechanical (Micro-Electro-Mechanical Systems/MEMS) methods. In this case, a plurality of layer systems can also be applied. Temperature sensors 43 can also be provided.

Figure 12:
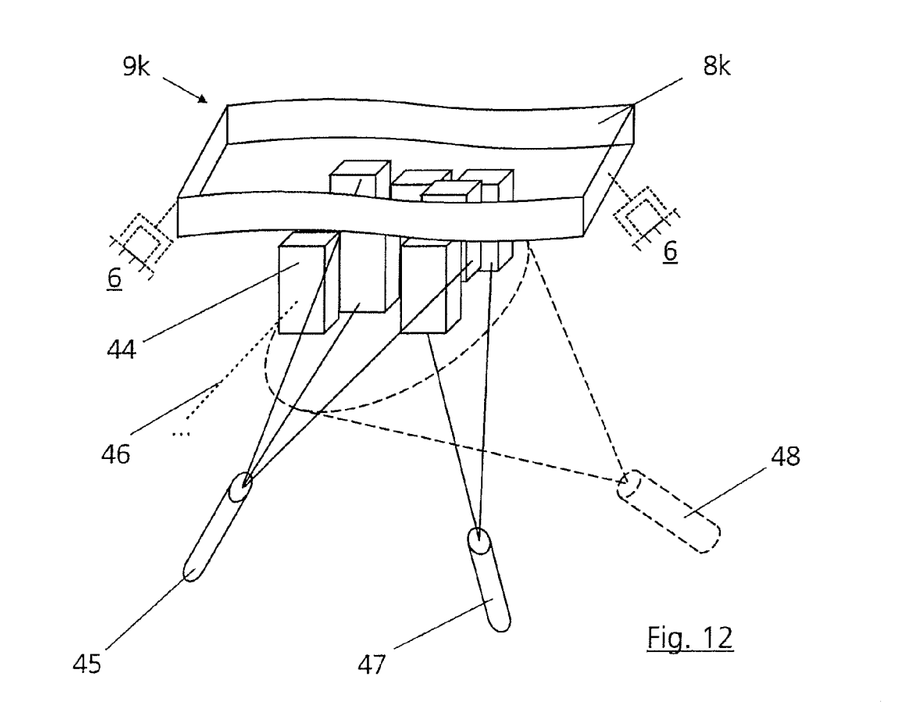
FIG. 12 shows a schematic illustration of an optical assembly in a projection exposure apparatus according to the disclosure with piezo-actuators and energy input via an electron gun.

FIG. 12 shows a further embodiment of an optical assembly 9$k$ with a mirror 8$k$. For the targeted mechanical actuation and/or deformation of the mirror 8$k$, a plurality of parallelepipedal piezo-actuators 44 are arranged below the mirror 8$k$ or on the rear side thereof.

As energy transmission device, an electron gun 45 is provided, which emits electrons as particle radiation onto the piezo-actuators 44 in a targeted manner. In further exemplary embodiments (not illustrated), such an electron gun 45 can also be provided as energy transmission device for the optical assembly 9$i$ from FIG. 11, electrons as particle radiation being emitted onto the projections 41 of the monolithic partial layer 40 or of the partial element formed in one piece for the mechanical actuation of the optical element 8$i$ in a targeted manner. The charge application by the electron gun 45 is effected by the emitted electrons being directed onto selected areas of the piezo-actuators 44 in a targeted manner, in order to electrically charge the latter. In this case, in a type of scanning method, the electron gun 45 can scan the entire array of piezo-actuators 44 e.g. in a line-by-line or meandering fashion and thus apply charge thereto.

For discharging the piezo-actuators 44 or the projections 41 of the monolithic partial layer 40 (not illustrated), provision can be made of an, in particular fine, discharge cable 46 (indicated in dashed fashion), a UV radiation source 47 (e.g. a UV laser scanner), which emits UV radiation onto the piezo-actuators 44 in a targeted manner, for example according to the scanning principle, or a UV radiation source 48 (indicated in dashed fashion), which emits UV radiation onto the piezo-actuators 44 areally. The discharge or the charge equalization is thus effected contactlessly via UV radiation on account of the photoelectric effect, that is to say via pn junctions that become conductive as a result of the incidence of light. Emission or absorption of electrons at a grid electrode can possibly be effected.

As a result of the targeted mechanical actuation and/or deformation of the mirrors 8$a$-8$k$, it is advantageously possible to effectively compensate for alterations of the optical properties as a result of heating of the optical elements or mirrors 8$a$-8$k$ of the projection objective 5 or of the projection objective 5 itself in the projection exposure apparatus 1, but also undulations caused by manufacturing tolerances. Aberrations and wavefronts can likewise be set in a targeted manner.

What is claimed is:

1. An apparatus, comprising:
    an optical assembly comprising:
        an optical element; and
        an actuator configured to deform the optical element;
    a first member configured to provide signals so that the actuator deforms the optical element; and
    a second member configured to provide signals so that the actuator deforms the optical element independently of signals from the first member,
    wherein:
        the first member is selected from the group consisting of a control signal transmission device, an energy transmission device and combinations thereof;
        if the first member comprises an energy transmission device, the energy transmission device is configured to provide contactless transmission of energy;
        the first member is configured to introduce no parasitic mechanical effects into the optical assembly at least during specific operating states of the apparatus; and
        the apparatus is a microlithography projection objective.

2. The apparatus of claim 1, wherein the first member comprises an energy transmission device, and the energy transmission device is configured to provide contactless transmission of energy.

3. The apparatus of claim 2, wherein contactless transmission of energy is achieved via induction or electromagnetic waves.

4. The apparatus of claim 1, wherein the first member comprises a control signal transmission device.

5. The apparatus of claim 4, wherein the control signal transmission device is configured to provide contactless transmission of control signals.

6. The apparatus of claim 5, wherein contactless transmission of control signals is achieved via induction or electromagnetic waves.

7. The apparatus of claim 1, wherein the first member comprises a transmitting device and a receiving device.

8. The apparatus of claim 7, wherein the apparatus comprises a housing, and the housing comprises the transmitting device and/or the receiving device.

9. The apparatus of claim 7, wherein the optical element or the optical assembly comprises the transmitting device and/or the receiving device.

10. The apparatus of claim 1, wherein the first member comprises a signal processing device.

11. The apparatus of claim 1, wherein the optical assembly comprises a sensor configured to sense the optical element.

12. The apparatus of claim 1, wherein the actuator comprises a piezo-actuator.

13. The apparatus of claim 1, wherein the optical assembly further comprises an energy store.

14. The apparatus of claim 1, further comprising a housing, wherein the first member comprises a mechanical link between the housing and the optical assembly.

15. The apparatus of claim 1, wherein first member comprises a spring element and an absorber mass.

16. The apparatus of claim 1, wherein the optical element comprises a mirror.

17. The apparatus of claim 1, further comprising a housing and Lorentz actuators, wherein the optical assembly is mounted in the housing via the Lorentz-actuators.

18. A system, comprising:
    an apparatus according to claim 1,
    wherein the system is a microlithography projection exposure apparatus.

19. The apparatus of claim 1, further comprising a control unit in signal communication with the first and second members.

20. The apparatus of claim 19, wherein the second member provides signals to the control device, and the signals contain information about the first member.

21. The apparatus of claim 19, wherein the first member is configured to introduce and/or update software on the second member.

22. An apparatus, comprising:
an optical assembly comprising:
an optical element; and
an actuator configured to mechanically actuate the optical element;
a first member configured to provide first signals so that during use of the apparatus the actuator: a) deforms the optical element; and/or b) manipulates a position of the optical element; and
a second member configured to provide second signals so that during use of the apparatus the actuator deforms the optical element independently of the first signals,
wherein:
the first member is selected from the group consisting of a control signal transmission device, an energy transmission device and combinations thereof;
if the first member comprises an energy transmission device, the energy transmission device is configured to provide contactless transmission of energy;
the first member is configured to introduce no parasitic mechanical effects into the optical assembly at least during specific operating states of the apparatus; and
the apparatus is a microlithography projection objective.

23. The apparatus of claim 22, further comprising a control unit in signal communication with the first and second members.

24. The apparatus of claim 23, wherein the second member provides signals to the control device, and the signals contain information about the first member.

25. The apparatus of claim 23, wherein the first member is configured to introduce and/or update software on the second member.

26. A system, comprising:
an apparatus according to claim 1,
wherein the system is a microlithography projection exposure apparatus.

* * * * *